United States Patent
Yang et al.

(10) Patent No.: US 11,635,658 B2
(45) Date of Patent: Apr. 25, 2023

(54) COLOR FILTER SUBSTRATE, DISPLAY PANEL AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Song Yang, Beijing (CN); Ge Shi, Beijing (CN); Haijun Niu, Beijing (CN); Yujie Liu, Beijing (CN); Ming Zhu, Beijing (CN); Shiyu Zhang, Beijing (CN); Zheng Fang, Beijing (CN); Yanliu Sun, Beijing (CN); Jiahui Han, Beijing (CN); Yuyao Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/419,161

(22) PCT Filed: Aug. 21, 2020

(86) PCT No.: PCT/CN2020/110575
§ 371 (c)(1),
(2) Date: Jun. 28, 2021

(87) PCT Pub. No.: WO2021/032198
PCT Pub. Date: Feb. 25, 2021

(65) Prior Publication Data
US 2022/0107533 A1 Apr. 7, 2022

(30) Foreign Application Priority Data
Aug. 22, 2019 (CN) .......................... 201910780149.9

(51) Int. Cl.
*G02F 1/13357* (2006.01)
*H01L 27/32* (2006.01)
(Continued)

(52) U.S. Cl.
CPC ..... *G02F 1/133617* (2013.01); *G02B 5/1809* (2013.01); *G02B 5/1819* (2013.01);
(Continued)

(58) Field of Classification Search
CPC ......... G02F 1/133614; G02F 1/133504; G02B 5/1809; G02B 5/1819; H01L 27/322; H01L 51/5262
See application file for complete search history.

(56) References Cited

U.S. PATENT DOCUMENTS

| 9,952,740 B1 | 4/2018 | Kim et al. |
| 2008/0025041 A1 | 1/2008 | Lee et al. |

(Continued)

FOREIGN PATENT DOCUMENTS

| CN | 101118346 A | 2/2008 |
| CN | 203658705 U | 6/2014 |

(Continued)

OTHER PUBLICATIONS

First Office Action of Priority Application No. CN 201910780149.9 dated Mar. 8, 2021.
(Continued)

*Primary Examiner* — Jonathan Y Jung
(74) *Attorney, Agent, or Firm* — IP & T Group LLP

(57) ABSTRACT

The color filter substrate includes a photoluminescent layer and an optical path adjustment layer. The photoluminescent layer includes a plurality of photoluminescent portions. Each photoluminescent portion is configured to receive backlight and emit excitation light. The optical path adjustment layer is located on a light incident side of the photolu-
(Continued)

minescent layer, and the optical path adjustment layer is configured to increase an incident angle of at least portion of the backlight that enters the photoluminescent layer.

16 Claims, 7 Drawing Sheets

(51) Int. Cl.
 *H01L 51/52*  (2006.01)
 *G02B 5/18*  (2006.01)
 *G02F 1/1335*  (2006.01)

(52) U.S. Cl.
 CPC ...... *G02F 1/133504* (2013.01); *H01L 27/322* (2013.01); *H01L 51/5262* (2013.01); *G02F 1/133512* (2013.01); *G02F 1/133528* (2013.01)

(56) References Cited

U.S. PATENT DOCUMENTS

| | | | |
|---|---|---|---|
| 2013/0063964 A1* | 3/2013 | Meir | G02B 6/005 362/555 |
| 2015/0285969 A1* | 10/2015 | Kim | G02B 5/201 359/891 |
| 2015/0380470 A1* | 12/2015 | Lee | H01L 27/3213 257/40 |
| 2017/0031205 A1 | 2/2017 | Lee | |
| 2017/0199427 A1 | 7/2017 | Zhang et al. | |
| 2018/0006093 A1* | 1/2018 | Kim | H01L 33/06 |
| 2018/0106940 A1 | 4/2018 | Kim et al. | |
| 2018/0172893 A1* | 6/2018 | Fattal | G02B 6/0035 |
| 2018/0292713 A1* | 10/2018 | Drolet | G02F 1/133621 |
| 2019/0018278 A1 | 1/2019 | Wang et al. | |
| 2019/0121193 A1* | 4/2019 | Ono | G02F 1/133528 |
| 2019/0285935 A1* | 9/2019 | Tan | G02F 1/133526 |
| 2019/0339566 A1* | 11/2019 | Tan | G02F 1/133514 |
| 2019/0391448 A1* | 12/2019 | Thothadri | G02B 27/30 |
| 2020/0050053 A1 | 2/2020 | Wang et al. | |
| 2020/0124780 A1* | 4/2020 | Li | G02B 6/0038 |
| 2020/0166680 A1 | 5/2020 | Meng et al. | |
| 2020/0278576 A1 | 9/2020 | Tan et al. | |

FOREIGN PATENT DOCUMENTS

| | | | | |
|---|---|---|---|---|
| CN | 104965341 A | | 10/2015 | |
| CN | 105629558 A | | 6/2016 | |
| CN | 205316168 U | | 6/2016 | |
| CN | 106292049 A | * | 1/2017 | ............ G02B 6/005 |
| CN | 106405918 A | | 2/2017 | |
| CN | 106707578 A | | 5/2017 | |
| CN | 106773306 A | | 5/2017 | |
| CN | 106980208 A | | 7/2017 | |
| CN | 107121841 A | | 9/2017 | |
| CN | 107193070 A | | 9/2017 | |
| CN | 206892501 U | | 1/2018 | |
| CN | 108196336 A | * | 6/2018 | ........... G02B 6/0011 |
| CN | 108196336 A | | 6/2018 | |
| CN | 108415191 A | * | 8/2018 | ....... G02F 1/133514 |
| CN | 108957839 A | | 12/2018 | |
| CN | 109031757 A | | 12/2018 | |
| CN | 109283735 A | | 1/2019 | |
| CN | 109638143 A | | 4/2019 | |
| CN | 110471210 A | | 11/2019 | |
| EP | 3620834 A1 | | 3/2020 | |
| KR | 10-2018-0042892 A | | 4/2018 | |

OTHER PUBLICATIONS

The Second Office Action of Priority Application No. CN 201910780149.9 dated Nov. 11, 2021.

* cited by examiner

COLOR FILTER SUBSTRATE, DISPLAY PANEL AND DISPLAY APPARATUS

CROSS-REFERENCE TO RELATED APPLICATIONS

This application is a national phase entry under 35 USC 371 of International Patent Application No. PCT/CN2020/110575, filed on Aug. 21, 2020, which claims priority to Chinese Patent Application No. 201910780149.9, filed on Aug. 22, 2019, which are incorporated herein by reference in their entirety.

TECHNICAL FIELD

The present disclosure relates to the field of display technologies, and in particular, to a color filter substrate, a display panel and a display apparatus.

BACKGROUND

Photoluminescence refers to a light-emission phenomenon generated by exciting a photoluminescent portion using ultraviolet light, visible light or infrared light. Photoluminescence roughly undergoes three main processes of absorbing backlight, transferring energy and emitting excitation light. Absorption of the backlight and emission of the excitation light both occur in a transition between energy levels, and both go through an excited state; whereas energy transfer occurs due to movement of the excited state.

A backlight absorption efficiency is one of key factors that affect a photoluminescence efficiency. In a case where the backlight absorption efficiency of the photoluminescent portion is low, the photoluminescence efficiency of the photoluminescent portion is also low.

SUMMARY

In one aspect, some embodiments of the present disclosure provide a color filter substrate. The color filter substrate includes a photoluminescent layer and an optical path adjustment layer. The photoluminescent layer includes a plurality of photoluminescent portions. Each photoluminescent portion is configured to receive backlight and emit excitation light. The optical path adjustment layer is located on a light incident side of the photoluminescent layer, and the optical path adjustment layer is configured to increase an incident angle of at least portion of the backlight that enters the photoluminescent layer.

In some embodiments, the optical path adjustment layer includes a grating layer. The grating layer includes a plurality of gratings arranged in an array. Light exit surfaces of the plurality of gratings are attached to a light incident surface of the photoluminescent layer. The plurality of gratings are configured such that the at least portion of the backlight is diffracted, so as to increase the incident angle of the portion of the backlight that enters the photoluminescent layer.

In some embodiments, a light incident surface of each photoluminescent portion is attached to a light exit surface of at least one of the plurality of gratings. A dimension of the grating in a first direction is less than an average wavelength of the backlight, and is less than a dimension of the photoluminescent portion in the first direction. The first direction is a direction parallel to the light incident surface of the photoluminescent layer and perpendicular to a length extension direction of the grating.

In some embodiments, a material of the plurality of gratings includes at least one of titanium dioxide, silicon nitride, indium tin oxide, and silicon.

In some embodiments, a period of the plurality of gratings ranges from 200 nm to 300 nm, and a duty cycle thereof ranges from 0.1 to 0.9.

In some embodiments, the plurality of gratings are sub-wavelength gratings.

In some embodiments, the plurality of gratings are divided into a plurality of groups of gratings. Each group of gratings includes at least two of the plurality of gratings. Each group of gratings corresponds to at least one photoluminescent portion.

In some embodiments, the optical path adjustment layer further includes a light-transmitting planarization layer disposed on the light incident side of the photoluminescent layer. At least portion of the light-transmitting planarization layer fills gaps between the plurality of gratings. Relative to the light incident surface of the photoluminescent layer, a light incident surface of the light-transmitting planarization layer is higher than light incident surfaces of the plurality of gratings, or a light incident surface of the light-transmitting planarization layer is flush with light incident surfaces of the plurality of gratings.

In some embodiments, the photoluminescent layer has a plurality of backlight through holes arranged in an array. The plurality of backlight through holes are arranged in parallel with the plurality of photoluminescent portions.

In some embodiments, the photoluminescent layer further includes a light-transmitting portion filled in each backlight through hole. The light-transmitting portion is made of a transparent light guide material.

In some embodiments, the optical path adjustment layer includes a grating layer and a light-transmitting planarization layer. The grating layer includes a plurality of gratings arranged in an array. The photoluminescent layer further includes a refractive index matching portion filled in each backlight through hole. A light incident surface of the refractive index matching portion is attached to a light exit surface of at least one of the plurality of gratings. A refractive index of the refractive index matching portion is less than a refractive index of the grating layer, and is greater than a refractive index of the light-transmitting planarization layer.

In some embodiments, the color filter substrate further includes a first base. The photoluminescent layer and the optical path adjustment layer are sequentially disposed on the first base.

The color filter substrate further includes a black matrix layer disposed between the first base and the optical path adjustment layer. Orthogonal projections, on the first base, of gaps each between two adjacent photoluminescent portions in the photoluminescent layer, and orthogonal projections, on the first base, of gaps each between a photoluminescent portion and an adjacent backlight through hole in the photoluminescent layer are within an orthogonal projection, on the first base, of the black matrix layer.

The color filter substrate further includes a filter layer disposed between the first base and the photoluminescent layer. The filter layer includes a plurality of filter portions. Each filter portion corresponds to one photoluminescent portion or one backlight through hole.

In some embodiments, a material of the photoluminescent portion includes a quantum dot material.

In some embodiments, the quantum dot material includes cadmium selenide, indium phosphide, copper indium sulfide, or perovskite.

In some embodiments, the plurality of photoluminescent portions includes first photoluminescent portions and second photoluminescent portions. The first photoluminescent portions are capable of emitting excitation light of a first color after receiving the backlight. The second photoluminescent portions are capable of emitting excitation light of a second color after receiving the backlight. The backlight is light of a third color. The first color, the second color, and the third color are three primary colors.

In another aspect, some embodiments of the present disclosure provide a display panel. The display panel includes the color filter substrate as described in some of the above embodiments.

In some embodiments, the display panel further includes a backlight module disposed on a light incident side of the color filter substrate and a controllable polarization module disposed between the backlight module and the color filter substrate. The controllable polarization module includes a first polarizer, an array substrate, a liquid crystal layer, and a second polarizer that are sequentially disposed in a direction from the backlight module to the color filter substrate and perpendicular to the color filter substrate.

In some other embodiments, the display panel further includes a light-emitting substrate disposed on a light incident side of the color filter substrate and a circular polarizer disposed on a side of the color filter substrate away from the light-emitting substrate. The light-emitting substrate includes an array substrate and a light-emitting layer disposed on a side of the array substrate proximate to the color filter substrate.

In yet another aspect, some embodiments of the present disclosure provide a display apparatus. The display apparatus includes the display panel as described in some of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
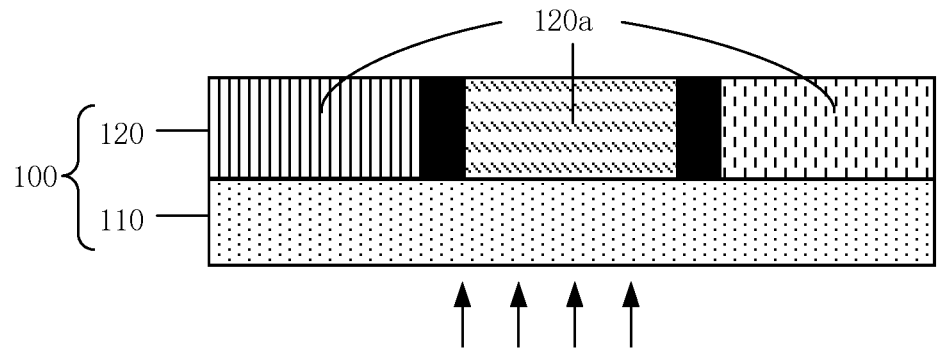
FIG. 1 is a schematic diagram showing a structure of a color filter substrate, in accordance with some embodiments of the present disclosure.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meaning, i.e., "including, but not limited to." In the description, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, "a plurality of/the plurality of" mean two or more unless otherwise specified.

In the description of some embodiments, terms such as "coupled" and "connected" and their derivatives may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, terms such as "coupled" or "communicatively coupled" may also mean that two or more components are not in direct contact with each other but still cooperate or interact with each other. The embodiments disclosed herein are not necessarily limited to the contents herein.

The use of "applicable to" or "configured to" herein means an open and inclusive expression, which does not exclude devices that are applicable to or configured to perform additional tasks or steps.

In addition, the use of "based on" is meant to be open and inclusive, since a process, step, calculation or other actions that is "based on" one or more of the stated conditions or values may, in practice, be based on additional conditions or values other than those stated.

Exemplary embodiments are described herein with reference to sectional views or plan views as idealized exemplary drawings. Regions shown in the accompanying drawings are schematic in nature, and their shapes are not intended to show actual shapes of the regions in a device, and are not intended to limit the scope of the exemplary embodiments.

At present, in the application of photoluminescence, an arrangement manner in which a backlight source is arranged opposite to a photoluminescent portion is used, so that backlight emitted by the backlight source may enter the photoluminescent portion as much as possible to be used for photoluminescence. A portion of the backlight with a higher light intensity enters the photoluminescent portion in normal incidence or at a small angle that deviates from the normal incidence, which can provide the photoluminescent portion with main light excitation energy. However, since the portion of the backlight enters the photoluminescent portion in normal incidence or in an approximately normal incidence, an optical path length of the backlight propagating in the photoluminescent portion may be easily limited by a size of the photoluminescent portion. Therefore, in a case where the size of the photoluminescent portion is limited, it is hard to effectively improve a backlight absorptivity of the photoluminescent portion.

Based on this, as shown in FIG. 1, some embodiments of the present disclosure provide a color filter substrate 100 that includes a photoluminescent layer 120 and an optical path adjustment layer 110. The photoluminescent layer 120 includes a plurality of photoluminescent portions 120a. Each photoluminescent portion 120a is configured to receive backlight and emit excitation light. In FIG. 1, a direction to which arrows below the optical path adjustment layer 110 point is an incident direction of the backlight. The optical path adjustment layer 110 is located on a light incident side of the photoluminescent layer 120, and the optical path adjustment layer 110 is configured to increase an incident angle of at least portion of the backlight that enters the photoluminescent layer 120.

In some embodiments of the present disclosure, by providing the optical path adjustment layer 110 on the light incident side of the photoluminescent layer 120, the optical path adjustment layer 110 can be used to appropriately adjust and control the incident angle of the backlight that enters the photoluminescent layer 120. For example, the optical path adjustment layer 110 is used to adjust the at least portion of backlight directed to the photoluminescent layer 120 from an optical path in normal incidence or at a small angle that deviates from the normal incidence to an optical path at a large angle (as long as the large angle is greater than the small angle) that deviates from the normal incidence. As a result, it is possible to increase the incident angle of the backlight with a higher light intensity that enters the photoluminescent layer 120, thereby increasing an optical path length of the backlight with the higher light intensity propagating in the photoluminescent layer 120. In this way, in a case where a size of the photoluminescent portion is limited, a backlight absorptivity of the photoluminescent layer 120 may also be effectively improved. Furthermore, intensity of the excitation light of the photoluminescent layer 120 can be enhanced to improve a luminous efficiency of the photoluminescent layer 120.

For example, the normal incidence refers to that the backlight is incident onto the photoluminescent layer in a direction perpendicular to a light incident surface of the photoluminescent layer, and the incident angle of the backlight is 0°. The small angle that deviates from the normal incidence is in a range from 0° to 10°. The large angle that deviates from the normal incidence is in a range from 10° to 30°, and includes a boundary value of 10° or 30°. Of course, it may allow that the large angle that deviates from the normal incidence is greater than 30°. The optical path adjustment layer 110 has a property of enabling the backlight to pass through smoothly and adjusting the incident angle of the backlight that enters the photoluminescent layer 120, and a structure of the optical path adjustment layer 110 may have a variety of implementations.

Figure 2:
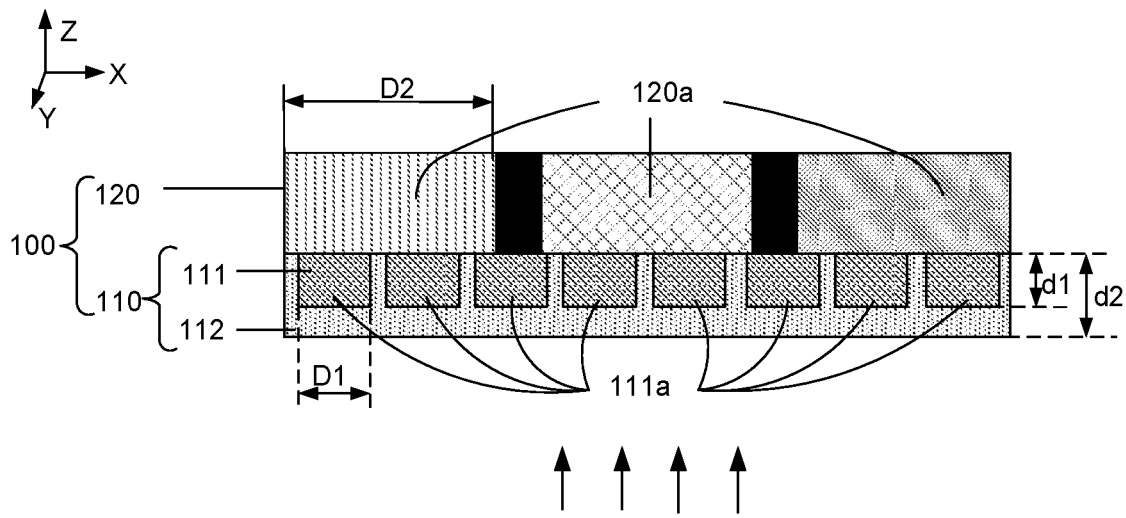
FIG. 2 is a schematic diagram showing a structure of another color filter substrate, in accordance with some embodiments of the present disclosure.

As shown in FIG. 2, in some embodiments, the optical path adjustment layer 110 includes a grating layer 111. The grating layer 111 includes a plurality of gratings 111a arranged in an array. Light exit surfaces of the plurality of gratings 111a are attached to the light incident surface of the photoluminescent layer 120. The plurality of gratings 111a are configured to diffract the at least portion of the backlight, so as to increase the incident angle of the portion of the backlight that enters the photoluminescent layer 120.

There is a gap between any two adjacent gratings 111a. After the backlight enters the grating layer 111, the portion of the backlight passing through the plurality of gratings 111a are diffracted, so that the incident angle of the portion of the backlight that enters the photoluminescent layer 120 is increased.

That the light exit surfaces of the plurality of gratings 111a are attached to the light incident surface of the photoluminescent layer 120 may be understood that the light exit surfaces of the plurality of gratings 111a are in direct contact with the light incident surface of the photoluminescent layer 120, or may be understood that the light exit surfaces of the plurality of gratings 111a are connected to the light incident surface of the photoluminescent layer 120 through an additional adhesive layer. A manner in which the light exit surfaces of the plurality of gratings 111a are attached to the light incident surface of the photoluminescent layer 120 is not particularly limited herein.

For example, as shown in FIG. 2, the light exit surfaces of the plurality of gratings 111a and the light incident surface of the photoluminescent layer 120 are in direct contact, which may avoid providing other light propagation media between the plurality of gratings 111a and the photoluminescent layer 120, thereby decreasing interference of the other light propagation media on the backlight, and ensuring an adjustment accuracy of the plurality of gratings 111a to the incident angle of the backlight.

In some embodiments, as shown in FIG. 2, the optical path adjustment layer 110 further includes a light-transmitting planarization layer 112 disposed on the light incident side of the photoluminescent layer 120, and the plurality of gratings 111a are disposed in the light-transmitting planarization layer 112. That is, at least a portion of the light-transmitting planarization layer 112 is filled in gaps between the plurality of gratings 111a.

In some embodiments, the light exit surfaces of the plurality of gratings 111a (upper surfaces of the gratings 111a in FIG. 2) are flush with a light exit surface of the light-transmitting planarization layer 112. A fixed connection between the grating layer 111 and the photoluminescent layer 120 may be achieved through the light-transmitting planarization layer 112.

In addition, relative positions between light incident surfaces of the plurality of gratings 111a (lower surfaces of the gratings 111a in FIG. 2) and a light incident surface of the light-transmitting planarization layer 112 may be set according to actual needs.

For example, as shown in FIG. 2, a distance d2 from the light incident surface of the light-transmitting planarization layer 112 to the light incident surface of the photoluminescent layer 120 is greater than a distance d1 from the light incident surfaces of the plurality of gratings 111a to the light incident surface of the photoluminescent layer 120.

Figure 3:
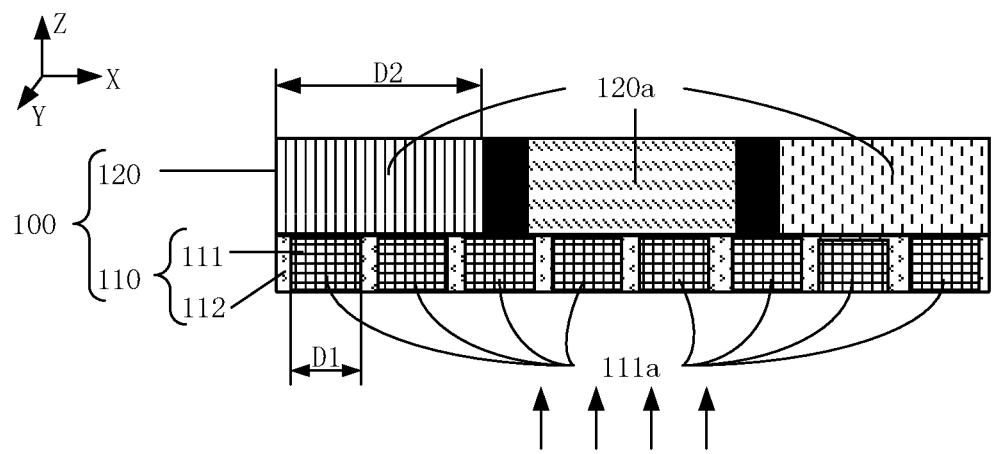
FIG. 3 is a schematic diagram showing a structure of yet another color filter substrate, in accordance with some embodiments of the present disclosure.

Or, as shown in FIG. 3, the light incident surface of the light-transmitting planarization layer 112 is flush with the light incident surfaces of the plurality of gratings 111a. A fixed connection between the grating layer 111 and other component(s) (e.g., a backlight layer that generates the backlight, or a liquid crystal layer) located on a light incident side of the grating layer 111 may be achieved through the light-transmitting planarization layer 112.

The light-transmitting planarization layer 112 is used for achieving the fixed connection between the grating layer 111 and other layer(s) or component(s), and the light-transmitting planarization layer 112 may adopt a solidifiable transparent liquid glue, such as a transparent glue cured by heat or ultraviolet light. In this way, the light-transmitting planarization layer 112 serves as a base of the grating layer 111, which not only allows the backlight to pass through, but also facilitates a good physical connection between the grating layer 111 and the photoluminescent layer 120 or other structure. It is possible to facilitate a formation of the color filter substrate 100, and also facilitate installation and use of the color filter substrate 100.

It will be noted that, the number of gratings 111a corresponding to each photoluminescent portion 120a may be selectively set according to actual needs. For example, a light incident surface of each photoluminescent portion 120a is attached to a light exit surface of at least one of the plurality of gratings 111a. That is, each photoluminescent portion 120a corresponds to at least one grating 111a. For example, each photoluminescent portion 120a may correspond to one grating 111a, or, each photoluminescent portion 120a may also correspond to gratings 111a.

For example, as shown in FIG. 2, according to a correspondence relationship between the gratings 111a and the photoluminescent portion 120a, the plurality of gratings 111a are divided into a plurality of groups of gratings, and each photoluminescent portion 120a corresponds to one group of gratings 111a. Each group of gratings includes at least two of the plurality of gratings. That is, the number of gratings 111a corresponding to each photoluminescent portion 120a is at least two. In this way, by providing at least two gratings 111a to correspond to one photoluminescent portion 120a, the backlight adjusted by the gratings 111a can smoothly and fully enter the corresponding photoluminescent portion 120a to reduce light loss.

It will be noted that, each grating 111a has an ability to independently adjust the incident angle of the backlight. By increasing the number of gratings 111a corresponding to each photoluminescent portion 120a, it is beneficial to increasing an adjustment accuracy of the incident angle of the backlight that enters each photoluminescent portion 120a, thereby further improving the backlight absorptivity of the photoluminescent portion 120a.

In some embodiments, a dimension of the grating 111a in a first direction is less than an average wavelength of the backlight, and is less than a dimension of the photoluminescent portion 120a in the first direction. The first direction is a direction parallel to the light incident surface of the photoluminescent layer 120 and perpendicular to a length extension direction of the grating 111a. For example, the grating 111a extends in a Y-axis direction in FIG. 2, that is, the length extension direction of the grating 111a is the Y-axis direction in FIG. 2, and the first direction is an X-axis direction in FIG. 2. That is, FIG. 2 is a cross-sectional view in a direction perpendicular to the length extension direction (Y-axis direction) of the plurality of gratings 111a.

It will be noted that, the dimension D1 of each grating 111a in the X-axis direction may be selectively set according to the average wavelength or a minimum wavelength of the backlight, and the dimension D1 of each grating 111a in the X-axis direction is not particularly limited herein.

In some examples, as shown in FIG. 3, the dimension D1 of each grating 111a in the X-axis direction is less than the average wavelength of the backlight, and is less than the dimension D2 of the photoluminescent portion 120a in the X-axis direction, which can ensure that the backlight can be diffracted in the grating 111a.

Herein, the wavelength of the backlight is related to a type or a color of the backlight. For example, in a case where the backlight adopts backlight of a single primary color, a value of the wavelength of the backlight may be within a certain numerical range, and the average wavelength of the backlight is an average value of a maximum value and a minimum value within the certain numerical range. Or, in a case where the wavelength of the backlight is a certain value, the certain value is the average wavelength of the backlight.

In some other examples, the dimension D1 of each grating 111a in the X-axis direction is less than the minimum wavelength of the backlight, and is less than the dimension D2 of the photoluminescent portion 120a in the X-axis direction, which can ensure that the backlight can be diffracted in the grating 111a.

It is explained herein that, excitation light of different colors may be generated by using backlight of different types or colors to match with a corresponding photoluminescent portion, thereby achieving a color display of the color filter substrate 100. However, if colors of the backlight are different, corresponding characteristics of the backlight are different, and requirements for parameters such as material, period, and duty cycle of the grating 111a are also different. For example, the backlight is light of blue color, and a material of the plurality of gratings 111a is at least one of titanium dioxide, silicon nitride, indium tin oxide, and silicon. A period of the plurality of gratings 111a ranges from 200 nm to 300 nm, and a duty cycle thereof ranges from 0.1 to 0.9. Of course, in some other examples, the backlight is light of any of other colors or light of any of other types. The material of the plurality of gratings 111a may also be at least one of titanium dioxide, silicon nitride, indium tin oxide, and silicon. The period of the plurality of gratings 111a ranges from 200 nm to 300 nm or varies accordingly, and the duty cycle thereof ranges from 0.1 to 0.9 or varies accordingly.

In some embodiments, the grating 111a is a sub-wavelength grating. The sub-wavelength grating is a microstructure with an anti-reflection property, and a grating period of the sub-wavelength grating is much less than a wavelength of an incident light. By setting that a structure of the grating 111a is the sub-wavelength grating, the grating may have zero reflectivity, thereby ensuring that the backlight has a good diffraction characteristic when passing through the sub-wavelength grating.

As is known to all, the three primary colors of red (R), green (G) and blue (B) may synthesize, after mixed in a certain ration, most colors in nature. In the field of display technologies, generally, a full-color display is realized based on a basic principle of toning of the three primary colors (R, G and B). The color filter substrate 100 provided in some embodiments of the present disclosure may also realize a full-color display. For example, when ultraviolet light (UV) is used as the backlight, the photoluminescent portions of the three primary colors of R, G and B are matched, the light of three primary colors of R, G and B can be emitted through excitation, further realizing the color mixing of the three primary colors of R, G and B.

In some embodiments of the present disclosure, based on the aforementioned full-color toning, if light of blue primary color is used as the backlight, there is a need to match with the photoluminescent portions, so that light of red primary color and light of green primary color may be emitted through excitation. In a case where any of the light of three primary colors of R, G and B is used as the backlight, backlight through holes may be provided in the photoluminescent layer 120 to directly lead out a portion of backlight, so that the portion of backlight may be mixed with the light of other two primary colors generated through excitation of the photoluminescent portions.

For example, by providing the backlight through holes 120b in the photoluminescent layer 120, or providing, in the backlight through holes 120b, light-transmitting portions 120d made of a light guide material such as transparent resin, the portion of backlight may directly pass through, and the portion of backlight may be mixed with excitation light generated through excitation of the photoluminescent portions 120a, which may achieve the full-color display. In addition, there is no need to provide photoluminescent portions in the backlight through holes 120b, which saves costs and improves a utilization rate of the backlight.

Figure 4:
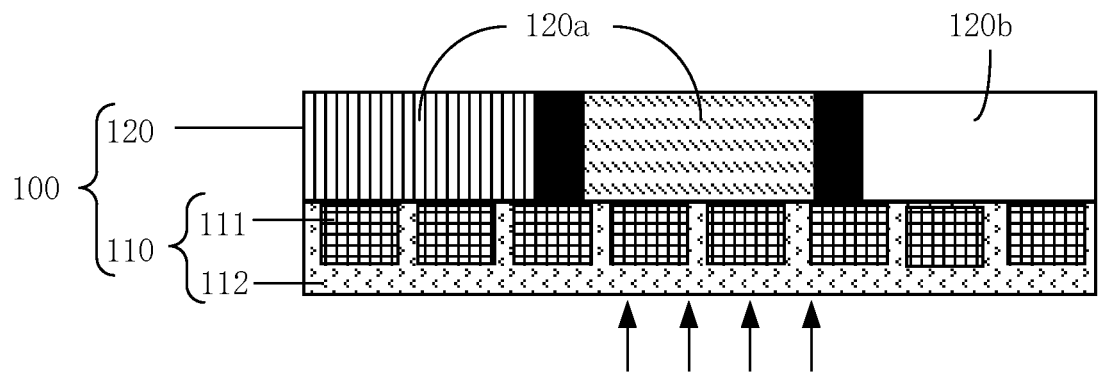
FIG. 4 is a schematic diagram showing a structure of yet another color filter substrate, in accordance with some embodiments of the present disclosure.

In some embodiments, the photoluminescent layer 120 further includes a plurality of backlight through holes 120b arranged in an array, and the plurality of backlight through holes 120b and the plurality of photoluminescent portions 120a are arranged in parallel. For example, as shown in FIG. 4, each backlight through hole 120b and at least one photoluminescent portion 120a are arranged in parallel. Here, the backlight through hole 120b is located beside the photoluminescent portion 120a, and a direction of exit light after the backlight passes through the backlight through hole 120b is the same as a direction of the excitation light generated after the photoluminescent portion 120a is excited.

Optionally, each backlight through hole 120b is located beside one corresponding photoluminescent portion 120a, and is arranged in parallel with the photoluminescent portion 120a. In this way, the backlight passing through the backlight through hole 120b can be mixed with one type of excitation light. For example, the backlight of blue primary color is mixed with excitation light of red primary color or excitation light of green primary color that is excited.

Optionally, each backlight through hole 120b is located beside corresponding photoluminescent portions 120a, and is arranged in parallel with the photoluminescent portions 120a. For example, in FIG. 4, each backlight through hole 120b and two photoluminescent portions 120a are arranged in parallel. In this case, the two photoluminescent portions 120a may be excited to emit excitation light of a same color or different colors.

For example, the two photoluminescent portions 120a can be excited to emit excitation light of the same color. In this way, the backlight passing through the backlight through hole 120b may be mixed with one type of excitation light.

Figure 6:
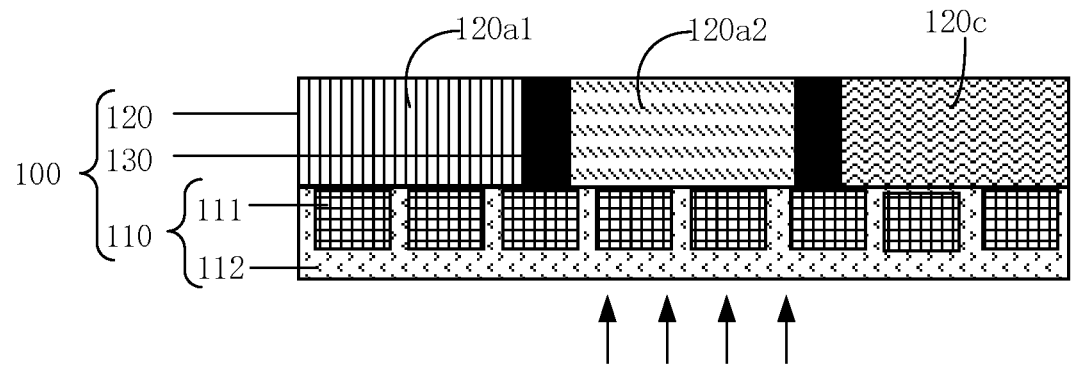
FIG. 6 is a schematic diagram showing a structure of yet another color filter substrate, in accordance with some embodiments of the present disclosure.

Or, as another example, two photoluminescent portions 120a1 and 120a2 in FIG. 6 are photoluminescent portions that can be excited to emit excitation light of different colors. In this way, the backlight passing through the backlight through hole 120b may be mixed with two types of excitation light. For example, the backlight of blue primary color is mixed with the excitation light of red primary color and the excitation light of green primary color that are excited. It will be noted that, a combination manner between the backlight through hole 120b and the photoluminescent portion 120a may be selectively set according to actual needs, and is not limited herein.

Figure 5:
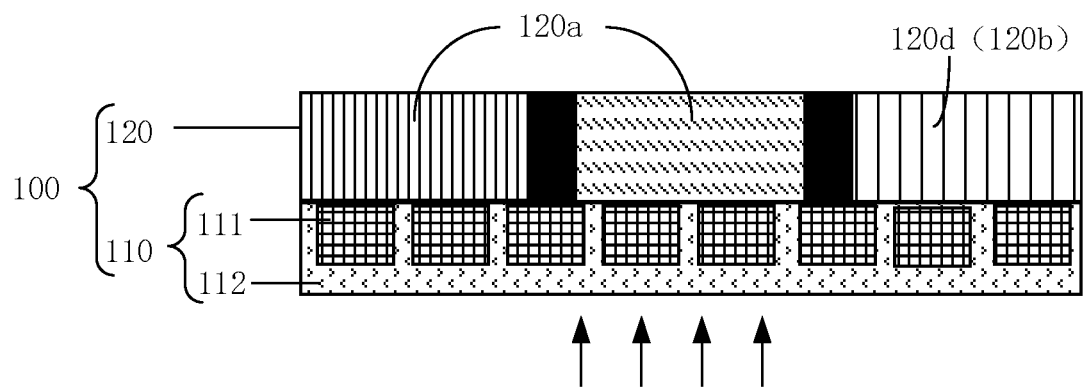
FIG. 5 is a schematic diagram showing a structure of yet another color filter substrate, in accordance with some embodiments of the present disclosure.

In some embodiments, as shown in FIG. 5, the photoluminescent layer 120 further includes a light-transmitting portion 120d filled in each backlight through hole 120b. The light-transmitting portion 120d may be made of a transparent light guide material, for example, a transparent resin.

In some embodiments, as shown in FIG. 6, the optical path adjustment layer 110 includes the grating layer 111 and the light-transmitting planarization layer 112. The grating layer 111 includes the plurality of gratings 111a arranged in an array. The photoluminescent layer 120 further includes a refractive index matching portion 120c filled in each backlight through hole 120b, and a light incident surface of the refractive index matching portion 120c is attached to the light exit surface of at least one of the plurality of gratings 111a.

By providing the refractive index matching portion 120cd in the backlight through hole 120b in the embodiments of the present disclosure, the refractive index matching portion 120c may be used to adjust a light field of the backlight passing through the backlight through hole 120b, thereby ensuring that the light field of the backlight passing through the backlight through hole 120b matches the light field of the excitation light of the photoluminescent portion 120a.

For example, with continued reference to FIG. 6, the plurality of photoluminescent portions 120a include first photoluminescent portions 120a1 and second photoluminescent portions 120a2. The first photoluminescent portions 120a1 are capable of emitting excitation light of a first color after receiving the backlight, the second photoluminescent portions 120a2 are capable of emitting excitation light of a second color after receiving the backlight, and the backlight is light of a third color. Light passing through the refractive index matching portion 120c is the light of the third color. By providing the refractive index matching portion 120c in the backlight through hole 120b, the refractive index matching portion 120c is capable of adjusting a light field of the light of the third color that passes through the backlight through hole 120b, so that the light field of the light of the third color matches the light field of the excitation light emitted by the photoluminescent layer 120, thereby improving a color mixing accuracy of the backlight and the excitation light. The first color, the second color, and the third color are three primary colors.

In some embodiments, a refractive index of the refractive index matching portion 120c is less than a refractive index of the grating layer 111, and is greater than a refractive index of the light-transmitting planarization layer 112, which can ensure that a light field of a portion of backlight that passes through the photoluminescent layer 120 is smoothly redistributed to match a light field of corresponding excitation light.

Optionally, if the backlight is the light of the blue primary color, the refractive index matching portion 120c may adopt a SiNx (a value of x may be greater than or equal to 1.3 and less than or equal to 1.5) material with a refractive index of approximately 1.67, so as to achieve a diffraction of the backlight of the blue primary color, and further achieve the redistribution of the light field of the backlight to match the light filed of the excitation light.

Figure 7:
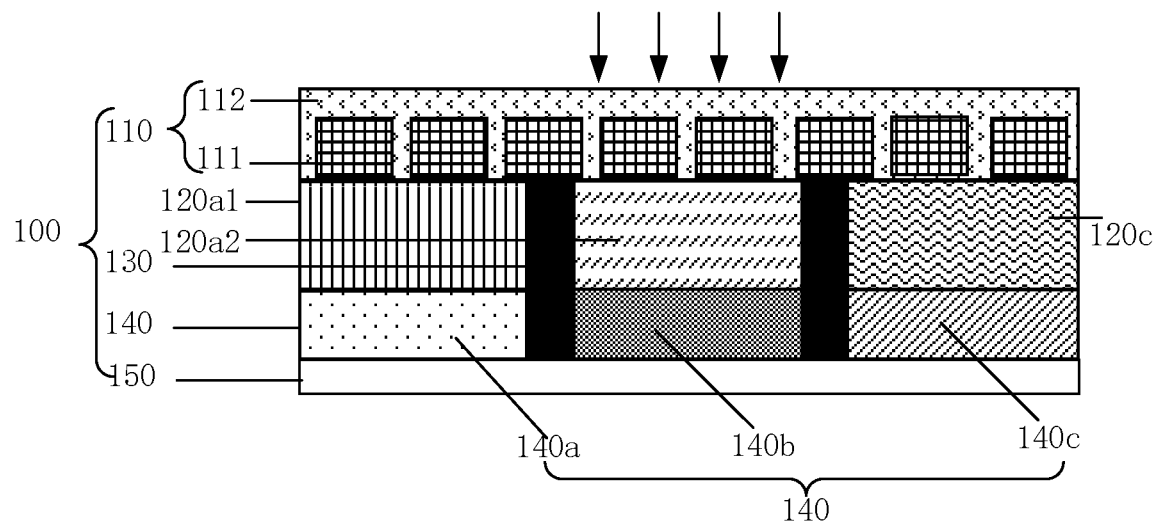
FIG. 7 is a schematic diagram showing a structure of yet another color filter substrate, in accordance with some embodiments of the present disclosure.

In some embodiments, as shown in FIG. 7, the color filter substrate 100 further includes a first base 150 and a black matrix layer 130 disposed on the first base 150. The photoluminescent layer 120 and the optical path adjustment layer 110 are sequentially disposed on the first base. The black matrix layer 130 is located between the first base 150 and the optical path adjustment layer 110, an orthogonal projection of the black matrix layer 130 on the first base 150 covers orthogonal projections, on the first base 150, of gaps each between two adjacent photoluminescent portions 120a in the photoluminescent layer 120 and gaps each between the photoluminescent portion 120a and the backlight through hole 120b that are adjacent in the photoluminescent layer 120.

The black matrix layer 130 can form boundaries between the photoluminescent portions 120a and between the photoluminescent portion 120a and the backlight through hole 120b. That is, the black matrix layer 130 is used to isolate each photoluminescent portion 120a and each backlight through hole 120b in the photoluminescent layer 120, thus optical paths of the excitation light in each photoluminescent portion 120a and the backlight in each backlight through hole 120b may be constrained, thereby avoiding crosstalk with excitation light of other photoluminescent portions 120a or exit light in other backlight through holes 120b. In this way, it is beneficial to ensuring a color display accuracy of the color filter substrate 100.

By providing a filter layer 140 on a light exit side of the photoluminescent layer 120, the excitation light emitted by the photoluminescent portion 120a may be corrected, avoiding a case that a color display quality of the color filter substrate 100 is affected due to a fact that the excitation light emitted by the photoluminescent portion 120a has certain color shift; and in addition, a false excitation to the photoluminescent portion 120a by ambient light may be reduced, ensuring the color display quality of the color filter substrate 100.

As shown in FIG. 7, the filter layer 140 includes first filter portions 140a, second filter portions 140b, and third filter portions 140c. Colors of the first filter portion 140a, the second filter portion 140b, and the third filter portion 140c are three primary colors.

In some embodiments, the photoluminescent portion 120a may adopt phosphors or quantum dots (QDs). A quantum dot material is, for example, cadmium selenide, indium phosphide, copper indium sulfur or perovskite.

The QDs has characteristics of electroluminescence and photoluminescence. After being excited, the QDs may emit fluorescence, and a color of the fluorescence may be determined by a material and a size of the QDs. Therefore, a particle diameter of the QDs may be adjusted to change a wavelength of light emitted by the QDs. Specifically, the smaller the particle diameter of the QDs is, the more blue the light emitted by the QDs is; the larger the particle diameter of the QDs is, the more red the light emitted by the QDs is. A category of a chemical composition of the QDs is various, and the color of the light emitted by the QDs may cover an entire visible region from blue light to red light. Moreover, the QDs has characteristics of high light absorption-luminescence efficiency, very narrow full width at half maximum, wide absorption spectrum and the like, so that the QDs has a high color purity and saturation. In addition, the QDs has a simple structure, and is thin and curved, which enable the QDs to be suitable for an application of current display field.

In order to clearly explain a method of manufacturing the color filter substrate in some of the above embodiments, the following description is made by taking the color filter substrate adopting a structure as shown in FIG. 7 as an example.

Referring to FIG. 7, the method of manufacturing the color filter substrate 100 includes steps 100 to 600 (S100 to S600).

In S100, the first base 150 is provided. The first base 150 may be a rigid base or a flexible base.

In S200, the black matrix film is fabricated on the first base 150 and is patterned, so as to form the black matrix layer in which a plurality of openings are provided.

In S300, the filter layer 140 is fabricated, and the filter layer 140 includes the first filter portions 140a, the second filter portions 140b, and the third filter portions 140c. Each filter portion is located in one opening of the black matrix layer 130, and different filter portions are distributed according to a color matching principle.

In S400, the photoluminescent portions 120a and the corresponding refractive index matching portions 120c are fabricated on the filter layer 140. Structures of the photoluminescent portion 120a and the refractive index matching portion 120c are as described above. Surfaces (i.e., light incident surfaces) of the photoluminescent portions 120a are flush with surfaces (i.e., light incident surfaces) of the corresponding refractive index matching portions 120c.

In S500, the plurality of gratings 111a are fabricated on surfaces of the photoluminescent portions 120a and the refractive index matching portions 120c away from the first base 150. A structure of each grating 111a is as described above.

In S600, the light-transmitting planarization layer 112 is fabricated on the first base 150 on which the plurality of gratings 111a have been fabricated, so as to make a surface of the color filter substrate 100 flat.

Some embodiments of the present disclosure provide a display panel. The display panel includes any of the color filter substrates 100 provided in some of the above embodiments.

Figure 8:
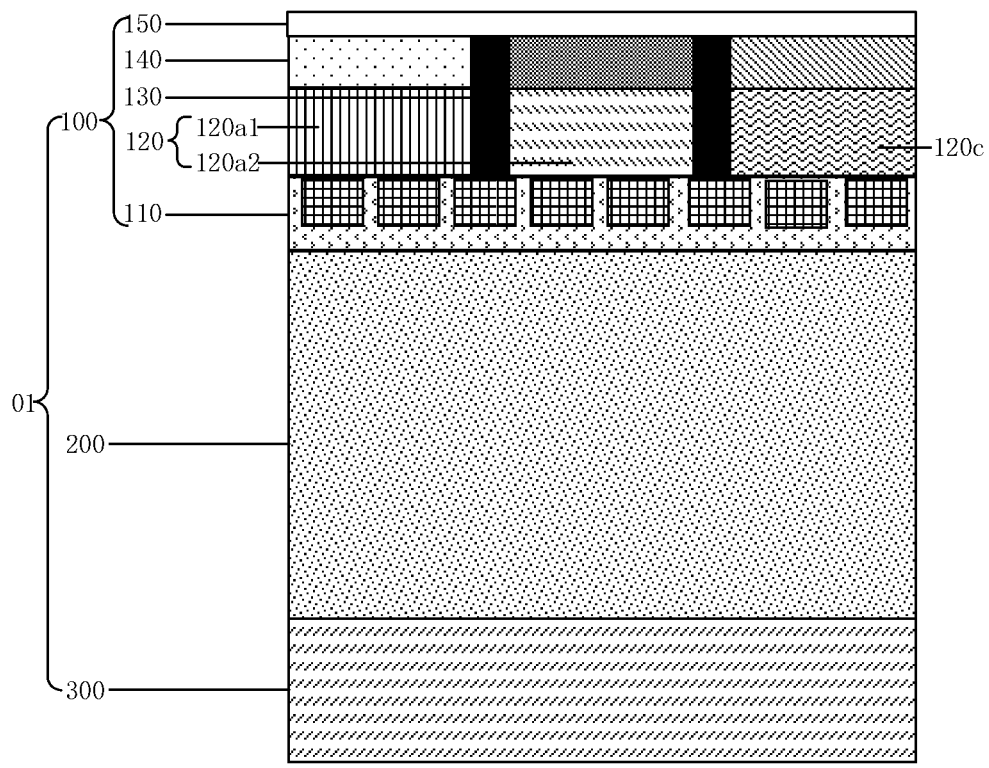
FIG. 8 is a schematic diagram showing a structure of a display panel, in accordance with some embodiments of the present disclosure.

In some embodiments, the display panel is a passive light-emitting display panel, such as a liquid crystal display panel. As shown in FIG. 8, the display panel 01 includes a backlight module 300, a controllable polarization module 200, and any of the color filter substrates 100 provided in some of the above embodiments.

The backlight module 300 is located at a light incident side of the optical path adjustment layer 110 in the color filter substrate 100. The controllable polarization module 200 is located between the backlight module 300 and the color filter substrate 100.

The backlight module 300 is used for emitting backlight, so that the color filter substrate 100 performs photoluminescence and display colors. The controllable polarization module 200 is used for polarizing the backlight to form linearly polarized light, and adjusting a polarization of the linearly polarized light, so as to control gray scale of the backlight. That is, the controllable polarization module 200 is capable of adjusting a brightness of the backlight according to display needs, and then enables the adjusted backlight to enter the color filter substrate.

Based on the basic principle of toning of three primary colors (R, G and B), the backlight module 300 and the controllable polarization module 200 may cooperate with the color filter substrate 100 provided in some of the aforementioned embodiments to achieve the full-color display.

In some examples, if the backlight module 300 is an excitation layer of first primary color light, the photoluminescent portions 120a in the photoluminescent layer 120 are photoluminescent portions of second primary color and photoluminescent portions of third primary color. That is, if the backlight is the light of first primary color, the excitation light is the light of second primary color and the light of third primary color. The first primary color, the second primary color, and the third primary color correspond to the three primary colors of R, G and B.

Optionally, if the backlight is the light of blue primary color, a photoluminescent material include, but is not limited to, cadmium selenide, indium phosphide, copper indium sulfur, or perovskite, so that the light of red primary color and the light of green primary color are emitted correspondingly through excitation.

Figure 9:
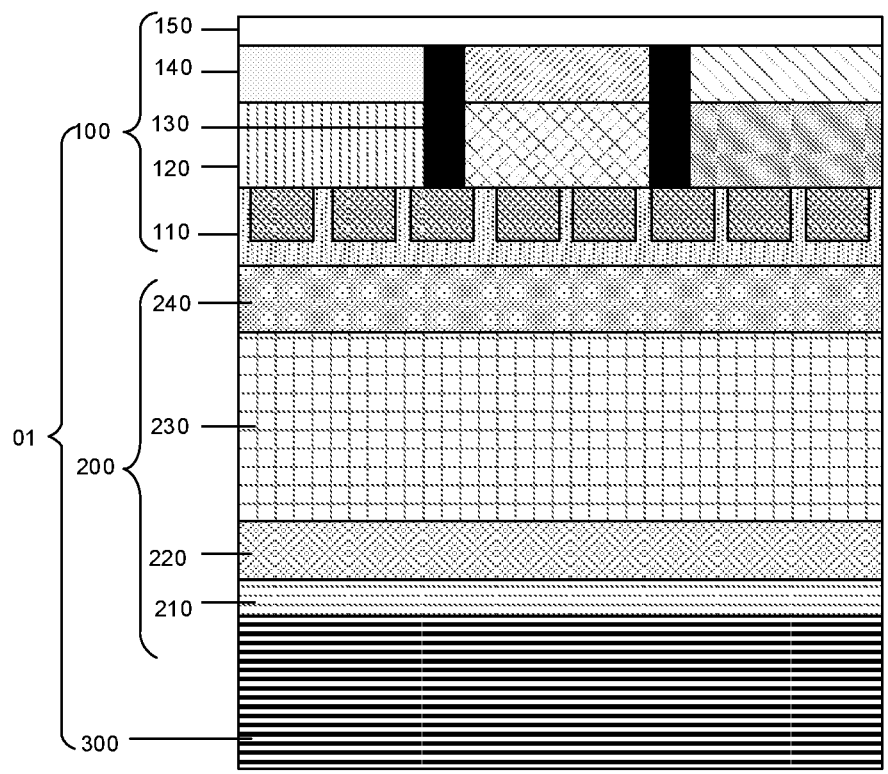
FIG. 9 is a schematic diagram showing a structure of another display panel, in accordance with some embodiments of the present disclosure.

The controllable polarization module 200 is capable of controlling the gray scale of the backlight. As shown in FIG. 9, in some embodiments, the controllable polarization module 200 includes a first polarizer 210, an array substrate 220, a liquid crystal layer 230, and a second polarizer 240 that are sequentially disposed in a direction from the backlight module 300 to the color filter substrate 100 and perpendicular to the color filter substrate 100.

The first polarizer 210 is used for polarizing the backlight to form the linearly polarized light. Optionally, the first polarizer 210 adopts a polarizer. The array substrate 220 is used for controlling a liquid crystal state of the liquid crystal layer 230. The liquid crystal layer 230 realizes polarization control of the linearly polarized light by changing its own state. The second polarizer 240 is used for analyzing, and may form a gray-scale control system in combination with the first polarizer 210 and the liquid crystal layer 230. Optionally, the second polarizer 240 may adopt a metal wire grid polarizer.

In some other embodiments, the display panel is an active light-emitting display panel, such as an organic light-emitting diode (OLED) display panel.

Figure 10:
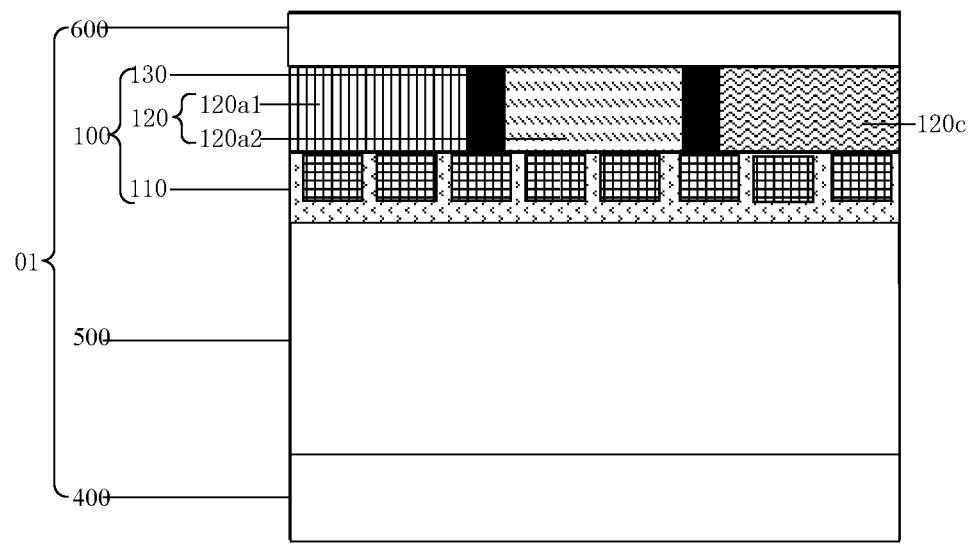
FIG. 10 is a schematic diagram showing a structure of yet another display panel, in accordance with some embodiments of the present disclosure.

In some embodiments, as shown in FIG. 10, the display panel 01 includes a light-emitting substrate, the color filter substrate 100, and a circular polarizer 600.

The light-emitting substrate is disposed on the light incident side of the color filter substrate 100. The light-emitting substrate includes an array substrate 400 and a light-emitting layer 500 disposed on a side of the array substrate 400 proximate to the color filter substrate 100. The color filter substrate 100 may be attached to a light exit side of the light-emitting substrate, for example, by an adhesive. Or, the color filter substrate 100 is directly fabricated on the light exit side of the light-emitting substrate.

The circular polarizer 600 is disposed on a side of the color filter substrate 100 away from the light-emitting substrate. For example, the circular polarizer 600 is attached onto a surface of the color filter substrate 100 away from the light-emitting substrate. In this way, the circular polarizer 600 is capable of preventing external light from entering an interior of the display panel 01 and causing interference to the display of the display panel 01.

Figure 11:
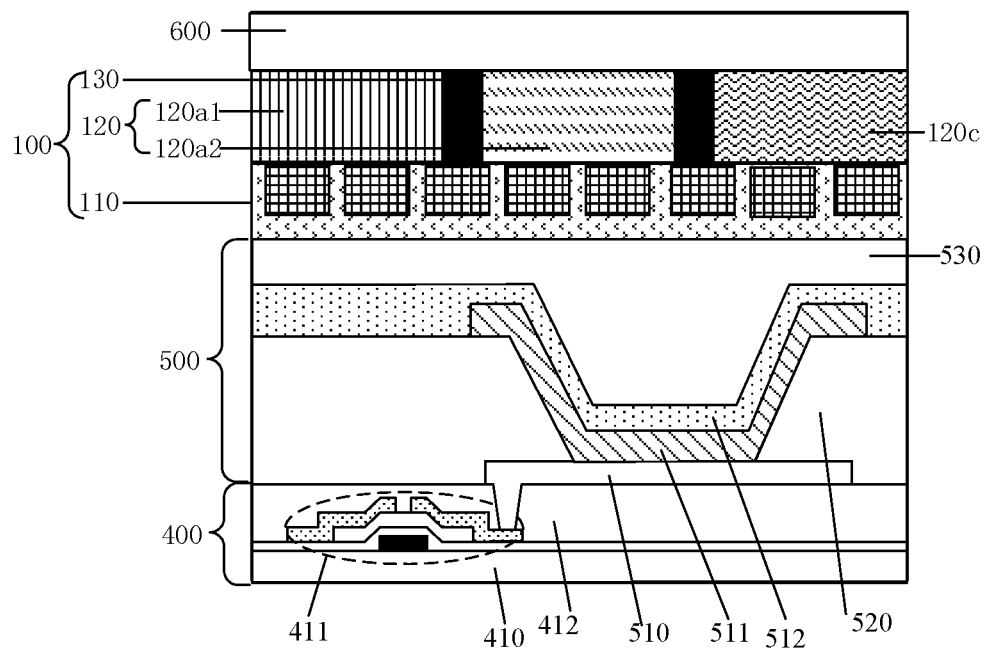
FIG. 11 is a schematic diagram showing a structure of yet another display panel, in accordance with some embodiments of the present disclosure.

Referring to FIG. 11, the light-emitting layer 500 includes light-emitting devices. The light-emitting devices are, for example, OLEDs. Each light-emitting device includes an anode 510, a cathode 512, and a light-emitting functional layer 511 located between the anode 510 and the cathode 512. The light-emitting layer 500 further includes a pixel defining layer 520. The pixel defining layer 520 has a plurality of openings distributed in an array, and each light-emitting device is located in one opening. The array substrate 400 includes a base substrate 410 and light-emitting driving circuits disposed on the base substrate 410. The light-emitting driving circuits are coupled to the light-emitting devices in a one-to-one correspondence. The light-emitting device is capable of emitting light due to driving action of the light-emitting driving circuit. Each light-emitting driving circuit is composed of electronic elements including thin film transistor(s) and capacitor(s) in series and parallel. FIG. 11 illustrates the light-emitting driving circuit with only one thin film transistor as an example, and a structure of the light-emitting driving circuit may be selectively set according to actual needs, and is not limited in the embodiments of the present disclosure.

In addition, the light-emitting layer 500 further includes an encapsulation layer 530 for encapsulating the light-emitting devices. In a case where the encapsulation layer 530 is located on a light exit side of the light-emitting devices, a surface of the encapsulation layer 530 is planarized, there is no need to arrange the first base 150 in the color filter substrate 100, and the color filter substrate 100 may be directly fabricated on the surface of the encapsulation layer 530. The photoluminescent layer 120 of the color filter substrate 100 is located on a side of the optical path adjustment layer 110 away from the light-emitting substrate.

Figure 12:
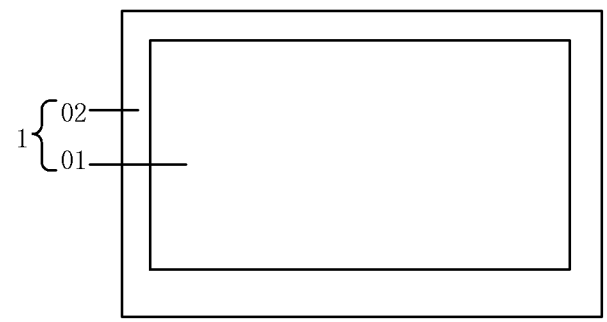
FIG. 12 is a schematic diagram showing a structure of a display apparatus, in accordance with some embodiments of the present disclosure.

Some embodiments of the present disclosure provide a display apparatus. For example, the display apparatus may be a television, a mobile phone, a computer, a notebook computer, a tablet computer, a personal digital assistant (PDA), a vehicle-mounted computer or any product with a display function. For example, as shown in FIG. 12, the display apparatus 1 includes any of display panels 01 provided in some of the above embodiments and a housing 02, and the display panel 01 is disposed in the housing 02. A specific form of the display apparatus is not particularly limited in the embodiments of the present disclosure.

In order to clearly illustrate technical effects that can be achieved by the color filter substrate in some embodiments of the present disclosure, a color filter substrate with an optical path adjustment layer and a color filter substrate without an optical path adjustment layer are analyzed and simulated below. The following analysis and simulation experiments are based on examples in which the backlight adopts the blue primary light and the photoluminescent portion 120a adopts the QDs.

Figure 13:
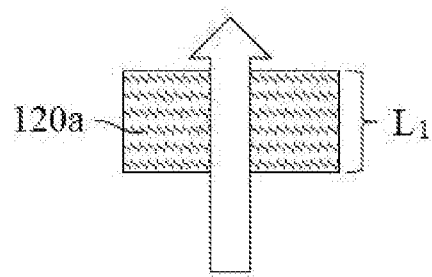
FIG. 13 is a schematic diagram showing an optical path of a photoluminescent portion in a case where there is no optical path adjustment layer, in accordance with some embodiments of the present disclosure.

In a case where there is no optical path adjustment layer in the color filter substrate 100, a schematic diagram of an optical path of the photoluminescent portion 120a is as shown in FIG. 13. An arrow in FIG. 13 indicates a direction of the optical path. A propagation length L1 of the backlight of blue primary color in the QDs is equal to HQD (L1=HQD), and an optical path length S1 is equal to a product of L1 and nQD (S1=L1×nQD). HQD is a thickness of the photoluminescent portion 120a, and nQD is a refractive index of the photoluminescent portion 120a.

Figure 14:
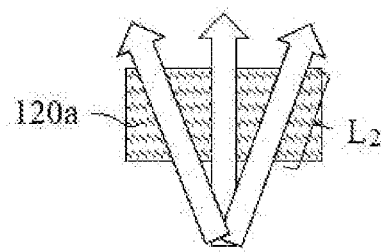
FIG. 14 is a schematic diagram showing an optical path of a photoluminescent portion in a case where there is an optical path adjustment layer, in accordance with some embodiments of the present disclosure.

In a case where there is an optical path adjustment layer in the color filter substrate 100, a schematic diagram of optical paths of the photoluminescent portion 120a is as shown in FIG. 14. Arrows in FIG. 14 indicate the directions of the optical paths. The optical path adjustment layer adjusts optical paths of the blue backlight before it enters the QDs, so that incident light at other angles is generated in addition to the light in normal incidence, so that a propagation length L2 of a portion of the incident light at other angles is greater than HQD (L2>HQD). In this way, an optical path length S2 of the blue backlight in the QDs is equal to a product of L2 and nQD (S2=L2×nQD). Compared with the foregoing, obviously, S2 is greater than S1 (S2>S1). As can be seen form the above, in some embodiments of the present disclosure, by providing the optical path adjustment layer 110 in the color filter substrate 100, an optical path of at least a portion of the backlight in the photoluminescent portion 120a may be increased, thereby improving a backlight absorptivity of the photoluminescent portion 120a.

QDs with a thickness of 5 micrometers (μm) is randomly selected, and a finite-difference time-domain (FDTD) method is used to simulate the case where there is the optical path adjustment layer 110 in the color filter substrate 100 and the case where there is no optical path adjustment layer 110 in the color filter substrate 100, which may obtain relative intensity of backlight and backlight absorptivity at different incident angles. In a case where there is no optical path adjustment layer 110 in the color filter substrate 100, data information of the backlight absorptivity is as shown in Table 1. In a case where there is the optical path adjustment layer 110 in the color filter substrate 100, and the optical path adjustment layer 110 adopts the gratings 111a, data information of the backlight absorptivity is as shown in Table 2.

TABLE 1

| An included angle between an incident optical path and a normal optical path (°) | Relative intensity of backlight | Backlight absorptivity (%) |
| --- | --- | --- |
| 0 | 1.000 | 87 |
| 5 | 0.971 | 87.1 |
| 10 | 0.860 | 87.3 |
| 15 | 0.712 | 87.8 |
| 20 | 0.545 | 88.4 |
| 25 | 0.350 | 89.2 |
| 30 | 0.175 | 90.2 |
| 35 | 0.057 | 91.3 |
| 40 | 0 | 92.5 |

TABLE 2

| An included angle between an incident optical path and a normal optical path (°) | Relative intensity of backlight | Backlight absorptivity (%) |
| --- | --- | --- |
| 0 | 1.000 | 87.5 |
| 5 | 0.971 | 89.4 |
| 10 | 0.860 | 88.8 |
| 15 | 0.712 | 89.4 |
| 20 | 0.545 | 89.5 |
| 25 | 0.350 | 89.7 |
| 30 | 0.175 | 90.1 |
| 35 | 0.057 | 90.5 |
| 40 | 0 | 91.2 |

Figure 15:
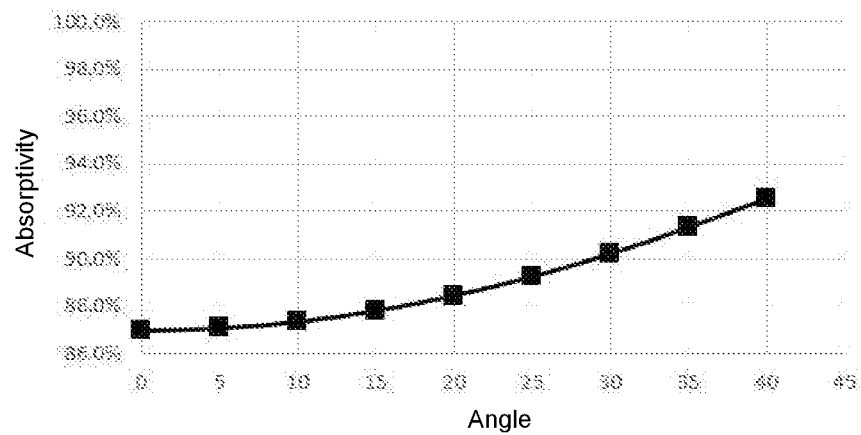
FIG. 15 is a simulation graph of a backlight absorptivity of a photoluminescent portion in a case where there is no optical path adjustment layer, in accordance with some embodiments of the present disclosure.

According to the data information in Table 1, a simulation curve of the backlight absorptivity in the case where there is no optical path adjustment layer 110 in the color filter substrate 100 is obtained as shown in FIG. 15. The absorptivity in FIG. 15 is the backlight absorptivity, the angle in FIG. 15 is the included angle between the incident optical path and the normal optical path, and a unit of the angle is degree (°). It can be seen that, the backlight absorptivity tends to increase along with an increase in the angle between the incident optical path and the normal optical path. That is, the larger an incident angle of the light of blue primary color in the QDs is, the larger the optical path length thereof is, and the larger a corresponding backlight absorptivity is.

Figure 16:
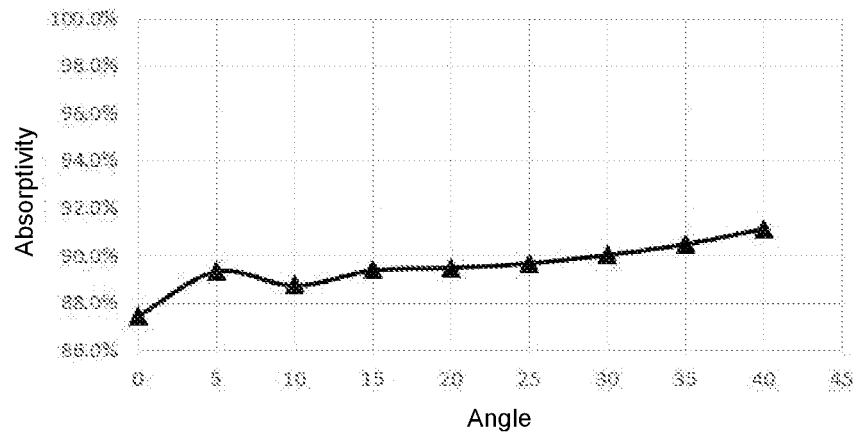
FIG. 16 is a simulation graph of a backlight absorptivity of a photoluminescent portion in a case where there is an optical path adjustment layer, in accordance with some embodiments of the present disclosure.

According to the data information in Table 2, a simulation curve of the backlight absorptivity in the case where there is the optical path adjustment layer 110 in the color filter substrate 100 is obtained as shown in FIG. 16. The absorptivity in FIG. 16 is the backlight absorptivity, the angle in FIG. 16 is the included angle between the incident optical path and the normal optical path, and a unit of the angle is degree (°). As can be seen form FIG. 16, in a case where the included angle between the incident optical path and the normal optical path is small (e.g., approximately 5°), the backlight absorptivity of the QDs has a jump increase. This is because a portion of the backlight with a small included angle between the incident optical path and the normal optical path has a higher light intensity, and its incident angle may increase under the adjustment of the gratings 111a, thereby increasing the light path length of the portion of backlight in the QDs, and enabling the backlight absorptivity to have a jump increase.

Figure 17:
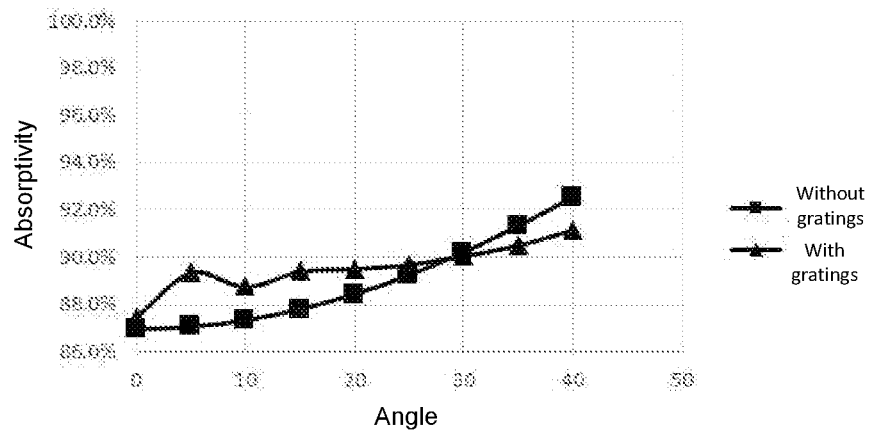
FIG. 17 is a simulation graph of comparison of backlight absorptivities of a photoluminescent portion in a case where there is an optical path adjustment layer and in a case where there is no optical path adjustment layer, in accordance with some embodiments of the present disclosure.

FIG. 17 is a diagram showing a comparison of simulation curves of the backlight absorptivity in the above two cases, and it can clearly obtain changes in the backlight absorptivity in the cases where there is the optical path adjustment layer 110 in the color filter substrate 100 and there is no optical path adjustment layer 110 in the color filter substrate 100. The absorptivity in FIG. 17 is the backlight absorptivity, the angle in FIG. 17 is the included angle between the incident optical path and the normal optical path, and a unit of the angle is degree (°). In FIG. 17, "without gratings" indicates that there is no optical path adjustment layer 110 in the color filter substrate 100, and "with gratings" indicates that there is the optical path adjustment layer 110 in the color filter substrate 100. As can be obviously seen from FIG. 17, in a case where the included angle between the incident optical path and the normal optical path is small, by providing the optical path adjustment layer 110 in the color filter substrate 100, the backlight absorptivity of the QDs is obviously greater than the backlight absorptivity of the QDs in the case there is no optical path adjustment layer 110 in the color filter substrate 100.

In addition, with continued reference to FIG. 17, in a case where the included angle between the incident optical path and the normal optical path of the backlight is large, for example, is greater than 30°, the backlight absorptivity of the QDs in the case where there is no optical path adjustment layer 110 in the color filter substrate 100 is greater than the backlight absorptivity of the QDs in the case where there is the optical path adjustment layer 110 in the color filter substrate 100. However, in combination with angular distribution characteristics of the backlight, the incident angles of most of the backlight incident onto the QDs are in a range of small angle, that is, the light with higher intensity appears in the range of small angle (the included angle between the incident optical path and the normal optical path). Therefore, by providing the optical path adjustment layer 110 in the color filter substrate 100, it will not adversely affect the backlight absorptivity of the QDs.

According to a principle that a total absorption of the QDs is equal to a product of light intensity of the backlight at each angle and the absorptivity of the QDs at each angle, a calculation formula of an average absorptivity $A_{QD}$ of the QDs may be derived.

$$A_{QD} = \frac{\Sigma(A_i * I_{Bi})}{[i]}. \quad \text{(Formula 1)}$$

In formula (1), i is a natural number and represents a value sequence number, $I_{Bi}$ represents a relative intensity of the backlight at an i-th included angle (the included angle between the incident optical path and the normal optical path), and [i] represents the number of values.

Parameters in Table 1 and Table 2 are substituted into the formula (1), the following $A_{QD}$ and $A_{GRA\&QD}$ are obtained.

$A_{QD} =$
$$\begin{pmatrix} 1*87\% + 0.971*87.1\% + 0.86*87.3\% + \\ 0.712*87.8\% + 0.545*88.4\% + \\ 0.35*89.2\% + 0.175*90.2\% + 0.057*91.3\% + 0*92.5\% \end{pmatrix} / 9 = 45.5\%$$

$A_{GRAD\&QD} =$
$$\begin{pmatrix} 1*87.5\% + 0.971*89.4\% + 0.86*88.8\% + \\ 0.712*89.4\% + 0.545*89.5\% + \\ 0.35*89.7\% + 0.175*90.1\% + 0.057*90.5\% + 0*91.2\% \end{pmatrix} / 9 = 46.2\%.$$

It can be obtained that the average absorptivity $A_{QD}$ of the QDs is equal to 45.5% in the case where there is no optical path adjustment layer 110 in the color filter substrate 100, and the average absorptivity $A_{GRA\&QD}$ of the QDs is equal to 46.2% in the case where there is the optical path adjustment layer 110 in the color filter substrate 100. Obviously, the average absorptivity of the QDs in the case where there is the optical path adjustment layer 110 in the color filter substrate 100 is greater than the average absorptivity of the QDs in the case where there is no optical path adjustment layer 110 in the color filter substrate 100.

Therefore, it will be proved that the color filter substrate 100 in the embodiments of the present disclosure can achieve the technical effects of adjusting the optical path of the backlight in normal incidence or at a small angle that deviates from the normal incidence to the optical path of the backlight at a large angle (as long as the large angle is greater than the small angle) that deviates from the normal incidence, i.e., increasing the incident angle of the backlight with a higher light intensity that enters the photoluminescent layer 120t. Thus, the propagation optical path length of the portion of the backlight with the higher light intensity in the photoluminescent layer 120 may be increased, and thereby the backlight absorptivity is improved, and the intensity of the excitation light of the photoluminescent layer 120 increases.

In a case where the backlight through hole 120b is disposed in the color filter substrate 100, an analysis and a simulation are made in some embodiments of the present disclosure in a case where there is the refractive index matching portion 120c in the backlight through hole 120b and in a case where there is no refractive index matching portion 120c in the backlight through hole 120b.

QDs with a thickness of 5 μm is randomly selected, and the FDTD method is used to simulate the case where there is the refractive index matching portion 120c in the backlight through hole 120b and the case where there is no refractive index matching portion 120c in the backlight through hole 120b, which may obtain relative intensity of the backlight at different incident angles and relative intensity of corresponding excitation light.

Figure 18:
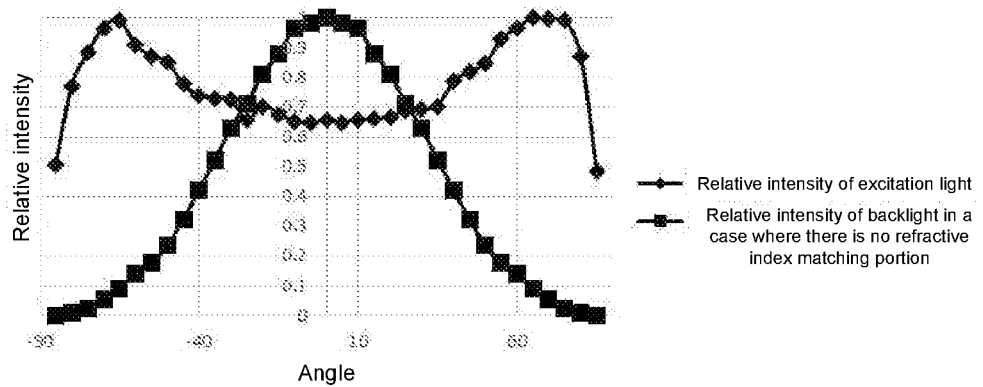
FIG. 18 is a diagram of comparison of simulation light field intensities of backlight and excitation light, in accordance with some embodiments of the present disclosure.

In the case where there is no refractive index matching portion 120c in the backlight through hole 120b, data information of the relative intensity of the backlight at different incident angles and the relative intensity of corresponding excitation light is as shown in Table 3, and a corresponding curve is as shown in FIG. 18.

Figure 19:
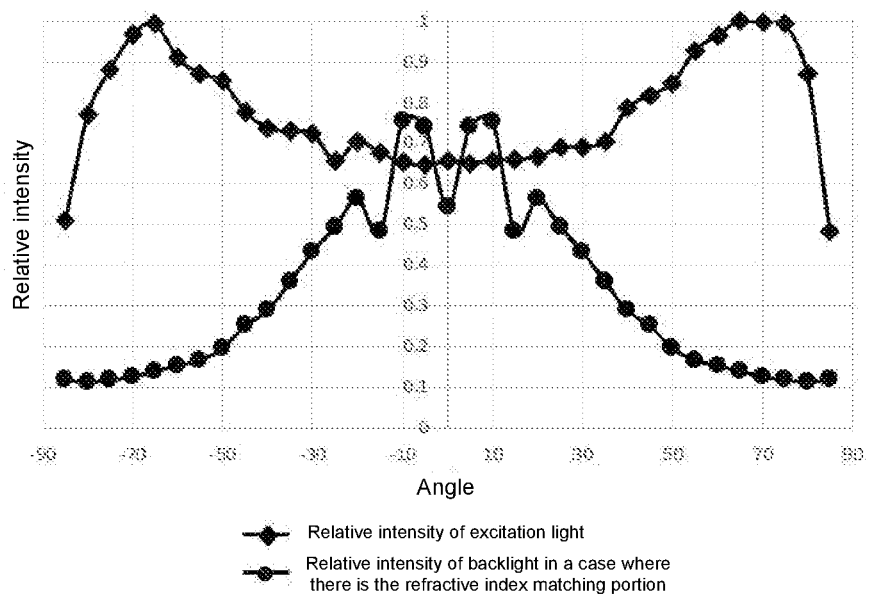
FIG. 19 is another diagram of comparison of simulation light field intensities of backlight and excitation light, in accordance with some embodiments of the present disclosure.

In the case where there is the refractive index matching portion 120c in the backlight through hole 120b, data information of the relative intensity of the backlight at different incident angles and the relative intensity of corresponding excitation light is as shown in Table 4, and a corresponding curve is as shown in FIG. 19.

TABLE 3

| An included angle between the incident optical path and the normal optical path (°) | Relative intensity of the backlight | Relative intensity of the excitation light |
| --- | --- | --- |
| −85 | 0 | 0.50805 |
| −80 | 0.0089 | 0.77013 |
| −75 | 0.0234 | 0.88141 |
| −70 | 0.05678 | 0.96633 |
| −65 | 0.0894 | 0.99268 |
| −60 | 0.142 | 0.90922 |
| −55 | 0.175 | 0.87116 |
| −50 | 0.234 | 0.85212 |
| −45 | 0.321 | 0.77745 |
| −40 | 0.421 | 0.73792 |
| −35 | 0.521 | 0.72914 |

TABLE 3-continued

| An included angle between the incident optical path and the normal optical path (°) | Relative intensity of the backlight | Relative intensity of the excitation light |
|---|---|---|
| −30 | 0.631 | 0.72474 |
| −25 | 0.712 | 0.65593 |
| −20 | 0.812 | 0.70425 |
| −15 | 0.879 | 0.67643 |
| −10 | 0.964 | 0.653 |
| −5 | 0.984 | 0.64568 |
| 0 | 1 | 0.65593 |
| 5 | 0.984 | 0.65007 |
| 10 | 0.964 | 0.65739 |
| 15 | 0.879 | 0.66032 |
| 20 | 0.812 | 0.66618 |
| 25 | 0.712 | 0.6896 |
| 30 | 0.631 | 0.69107 |
| 35 | 0.521 | 0.70425 |
| 40 | 0.421 | 0.78624 |
| 45 | 0.321 | 0.81845 |
| 50 | 0.234 | 0.84627 |
| 55 | 0.175 | 0.92679 |
| 60 | 0.142 | 0.96486 |
| 65 | 0.0894 | 1 |
| 70 | 0.05678 | 0.99707 |
| 75 | 0.0234 | 0.99268 |
| 80 | 0.0089 | 0.86969 |
| 85 | 0 | 0.48316 |

TABLE 4

| An included angle between the incident optical path and the normal optical path (°) | Relative intensity of the backlight | Relative intensity of the excitation light |
|---|---|---|
| −85 | 0.11748 | 0.50805 |
| −80 | 0.11242 | 0.77013 |
| −75 | 0.11738 | 0.88141 |
| −70 | 0.1259 | 0.96633 |
| −65 | 0.1391 | 0.99268 |
| −60 | 0.15344 | 0.90922 |
| −55 | 0.16616 | 0.87116 |
| −50 | 0.19624 | 0.85212 |
| −45 | 0.25105 | 0.77745 |
| −40 | 0.28857 | 0.73792 |
| −35 | 0.3594 | 0.72914 |
| −30 | 0.43319 | 0.72474 |
| −25 | 0.49407 | 0.65593 |
| −20 | 0.56169 | 0.70425 |
| −15 | 0.4815 | 0.67643 |
| −10 | 0.7534 | 0.653 |
| −5 | 0.73906 | 0.64568 |
| 0 | 0.54368 | 0.65593 |
| 5 | 0.73906 | 0.65007 |
| 10 | 0.7534 | 0.65739 |
| 15 | 0.4815 | 0.66032 |
| 20 | 0.56169 | 0.66618 |
| 25 | 0.49407 | 0.6896 |
| 30 | 0.43319 | 0.69107 |
| 35 | 0.3594 | 0.70425 |
| 40 | 0.28857 | 0.78624 |
| 45 | 0.25105 | 0.81845 |
| 50 | 0.19624 | 0.84627 |
| 55 | 0.16616 | 0.92679 |
| 60 | 0.15344 | 0.96486 |
| 65 | 0.1391 | 1 |
| 70 | 0.1259 | 0.99707 |
| 75 | 0.11738 | 0.99268 |
| 80 | 0.11242 | 0.86969 |
| 85 | 0.11748 | 0.48316 |

The relative intensity in FIG. 18 refers to a relative value of the intensity of the excitation light or the backlight of the blue primary color relative to a preset intensity of reference light, and the curve of the relative intensity of the backlight in the case where there is no refractive index matching portion 120c refers to a curve of a light field of the backlight of the blue primary color that does not pass through the grating 111a and the refractive index matching portion 120c. It can be seen from FIG. 18 that the curve of the light field of the backlight of the blue primary color is relatively obvious, and a curve of a light filed of the excitation light of the QDs is relatively flat. That is, a large deviation might exist between the light field of the backlight and the light field of the excitation light.

In FIG. 19, the curve of the relative intensity of the backlight in the case where there is the refractive index matching portion 120c refers to a curve of the light filed of the backlight of the blue primary color that passes through the grating 111a and the refractive index matching portion 120c. It can be seen from FIG. 19 that after the backlight of the blue primary color is adjusted by the grating 111a and the refractive index matching portion 120c, the curve of the light filed of the backlight of the blue primary color is relatively flat, which may reasonably reduce the deviation between the light filed of the backlight and the light field of the excitation light.

An average deviation is used below to measure a degree of deviation between the light filed of the backlight and the light filed of the excitation light.

$$\Delta I_1 = \frac{\sum_i (I_{BLU_i} - I_{QD_i})^2}{[i]}. \qquad \text{Formula (2)}$$

In formula (2), i is a natural number and represents a value sequence number, $I_{BLU_i}$ represents the relative intensity of the backlight at the i-th included angle (the included angle between the incident optical path and the normal optical path), $I_{QD_i}$ represents the relative intensity of the excitation light of the QDs corresponding to the backlight at the i-th included angle, and [i] represents the number of values.

Parameters in Tables 3 and 4 are substituted into the formula (2) to obtain $\Delta I_1$ and $\Delta I_2$.

$$\Delta I_1 = \frac{(0 - 0.50805)^2 + (0.0089 - 0.77013)^2 + \cdots + (0.0089 - 0.86969)^2 + (0 - 0.48316)^2}{35} = 0.324; \text{ and}$$

$$\Delta I_2 = \frac{(0.11748 - 0.50805)^2 + (0.11242 - 0.77013)^2 + \cdots + (0.11242 - 0.86969)^2 + (0.11748 - 0.48316)^2}{35} = 0.297.$$

It can be obtained that, in the case where there is no refractive index matching portion 120c in the backlight through hole 120b, a deviation $\Delta I_1$ between the light field of the backlight and the light field of the excitation light equals to 0.324 ($\Delta I_1$=0.324). In the case where there is the refractive index matching portion 120c in the backlight through hole 120b, a deviation $\Delta I_2$ between the light field of the backlight and the light field of the excitation light equals to 0.297 ($\Delta I_2$=0.297). It is obvious that $\Delta I_2$ is less than $\Delta I_1$ ($\Delta I_2 < \Delta I_1$). It can be proved that a combination of the grating 111a and the refractive index matching portion 120c may reduce the deviation between the light field of the backlight of the blue primary color and the light field of the excitation light emitted by the photoluminescent portion 120a, thereby achieving a match between the light field of the backlight and the light field of the excitation light.

In summary, by applying the color filter substrate 100 in the embodiments of the present disclosure to the display apparatus, at least the following beneficial effects can be achieved.

1. By using the optical path adjustment layer 110 disposed on the light incident side of the photoluminescent layer 120, the optical path of the backlight in normal incidence or at the small angle that deviates from the normal incidence may be adjusted to the optical path of the backlight at the large angle that deviates from the normal incidence, thereby increasing the incident angle of the portion of backlight with higher light intensity that enters the photoluminescent layer 120. Furthermore, the propagation optical path length of the portion of the backlight with higher light intensity in the photoluminescent layer 120 increases. In this way, it is possible to improve the backlight absorptivity of the photoluminescent portion 120a, and further enhance the intensity of the excitation light of the photoluminescent portion 120a.

2. The optical path adjustment layer 110 adopts unitized gratings 111a, that is, the plurality of gratings 111a are used to constrain the passing backlight, which may reduce light loss. In addition, by using each grating 111a to independently adjust the incident angle of the backlight passing therethrough, the backlight may have different incident angles. In this way, each grating 111a has an independent adjustment angle to the incident angle of the backlight according to a relative position between the each grating 111a itself and a corresponding photoluminescent portion 120a, which can allow high adjustment accuracy of the incident angle of the backlight, and be beneficial to further improving the backlight absorptivity.

3. By providing the backlight through hole 120b in the photoluminescent layer 120, a portion of the backlight may be emitted directly passing through the backlight through hole 120, and mix with the excitation light generated by the photoluminescent portion 120a. In this way, there is no need to provide the photoluminescent portion 120a in the backlight through hole 120b, which saves costs and improves a utilization rate of the backlight on a basis of achieving the full-color display.

4. The refractive index matching portion 120c is disposed in the backlight through hole 120b, so that a portion of the backlight, when passing through the grating 111a and the backlight through hole 120b, may realize a redistribution of the light filed of the excitation light and the light filed of the backlight under action of the grating 111a and the refractive index matching portion 120c. That is, a match between the light field of the backlight and the light field of the excitation light is achieved, which can improve a color mixing accuracy of the backlight and the excitation light.

5. The black matrix layer 130 is used to isolate each photoluminescent portion 120a and each backlight through hole 120b in the photoluminescent layer 120, so that the backlight and the excitation light in each photoluminescent portion 120a, and the backlight in each backlight through hole 120b are effectively constrained, which can avoid crosstalk between the light and light in other photoluminescent portions 120a or backlight through holes 120b, and is beneficial to ensuring a color display accuracy of the color filter substrate 100.

6. By providing the filter layer 140 on the light exit side of the photoluminescent layer 120, the excitation light emitted by the photoluminescent portion 120a may be corrected. In addition, false excitation to the photoluminescent portion 120a by the ambient light may be reduced, thereby ensuring a color display quality of the color filter substrate 100.

In the description, specific features, structures, materials or characteristics may be combined in any suitable manner in any one or more embodiments or examples.

The foregoing descriptions are merely specific implementation manners of the present disclosure, but the protection scope of the present disclosure is not limited thereto, and changes or replacements that any person skilled in the art could conceive of within the technical scope disclosed by the present disclosure should be within the protection scope of the present disclosure. Therefore, the protection scope of the present disclosure shall be subject to the protection scope of the claims.

What is claimed is:

1. A color filter substrate, comprising a photoluminescent layer and an optical path adjustment layer;
    the photoluminescent layer including a plurality of photoluminescent portions, and each photoluminescent portion being configured to receive backlight and emit excitation light; and
    the optical path adjustment layer being located on a light incident side of the photoluminescent layer, and the optical path adjustment layer being configured to increase an incident angle of at least portion of the backlight that enters the photoluminescent layer; wherein
    the photoluminescent layer has a plurality of backlight through holes arranged in an array, and the plurality of backlight through holes are arranged in parallel with the plurality of photoluminescent portions;
    the optical path adjustment layer includes a grating layer and a light-transmitting planarization layer, and the grating layer includes a plurality of gratings arranged in an array;
    the photoluminescent layer further includes a refractive index matching portion filled in each backlight through hole, and a light incident surface of the refractive index matching portion is attached to a light exit surface of at least one of the plurality of gratings; and
    a refractive index of the refractive index matching portion is less than a refractive index of the grating layer, and is greater than a refractive index of the light-transmitting planarization layer.

2. The color filter substrate according to claim 1, wherein light exit surfaces of the plurality of gratings are attached to a light incident surface of the photoluminescent layer; and
    the plurality of gratings are configured such that the at least portion of the backlight is diffracted, so as to increase the incident angle of the portion of the backlight that enters the photoluminescent layer.

3. The color filter substrate according to claim 2, wherein a light incident surface of each photoluminescent portion is attached to a light exit surface of at least one of the plurality of gratings;
    a dimension of the grating in a first direction is less than an average wavelength of the backlight, and is less than a dimension of the photoluminescent portion in the first direction; and
    the first direction is a direction parallel to the light incident surface of the photoluminescent layer and perpendicular to a length extension direction of the grating.

4. The color filter substrate according to claim 2, wherein a material of the plurality of gratings includes at least one of titanium dioxide, silicon nitride, indium tin oxide, and silicon.

5. The color filter substrate according to claim 2, wherein a period of the plurality of gratings ranges from 200 nm to 300 nm, and a duty cycle thereof ranges from 0.1 to 0.9.

6. The color filter substrate according to claim 2, wherein the plurality of gratings are sub-wavelength gratings.

7. The color filter substrate according to claim 2, wherein the plurality of gratings are divided into a plurality of groups of gratings, and each group of gratings includes at least two of the plurality of gratings, and each group of gratings corresponds to at least one photoluminescent portion.

8. The color filter substrate according to claim 2, wherein the light-transmitting planarization layer is disposed on the light incident side of the photoluminescent layer;
  at least portion of the light-transmitting planarization layer fills gaps between the plurality of gratings; and
  relative to the light incident surface of the photoluminescent layer, a light incident surface of the light-transmitting planarization layer is higher than light incident surfaces of the plurality of gratings, or a light incident surface of the light-transmitting planarization layer is flush with light incident surfaces of the plurality of gratings.

9. The color filter substrate according to claim 1, further comprising:
  a first base, the photoluminescent layer and the optical path adjustment layer being sequentially disposed on the first base;
  a black matrix layer disposed between the first base and the optical path adjustment layer, orthogonal projections, on the first base, of gaps each between two adjacent photoluminescent portions in the photoluminescent layer, and orthogonal projections, on the first base, of gaps each between a photoluminescent portion and an adjacent backlight through hole in the photoluminescent layer being within an orthogonal projection, on the first base, of the black matrix layer; and
  a filter layer disposed between the first base and the photoluminescent layer, the filter layer including a plurality of filter portions, and each filter portion corresponding to one photoluminescent portion or one backlight through hole.

10. The color filter substrate according to claim 1, wherein a material of the photoluminescent portion includes a quantum dot material.

11. The color filter substrate according to claim 10, wherein the quantum dot material includes cadmium selenide, indium phosphide, copper indium sulfide, or perovskite.

12. The color filter substrate according to claim 1, wherein the plurality of photoluminescent portions includes first photoluminescent portions and second photoluminescent portions;
  the first photoluminescent portions are capable of emitting excitation light of a first color after receiving the backlight, the second photoluminescent portions are capable of emitting excitation light of a second color after receiving the backlight, and the backlight is light of a third color; and
  the first color, the second color, and the third color are three primary colors.

13. A display panel, comprising the color filter substrate according to claim 1.

14. The display panel according to claim 13, further comprising:
  a backlight module disposed on a light incident side of the color filter substrate; and
  a controllable polarization module disposed between the backlight module and the color filter substrate;
  wherein the controllable polarization module includes a first polarizer, an array substrate, a liquid crystal layer, and a second polarizer that are sequentially disposed in a direction from the backlight module to the color filter substrate and perpendicular to the color filter substrate.

15. The display panel according to claim 13, further comprising:
  a light-emitting substrate disposed on a light incident side of the color filter substrate; and
  a circular polarizer disposed on a side of the color filter substrate away from the light-emitting substrate;
  wherein the light-emitting substrate includes an array substrate and a light-emitting layer disposed on a side of the array substrate proximate to the color filter substrate.

16. A display apparatus, comprising the display panel according to claim 13.

* * * * *